(12) United States Patent
Miyasaka

(10) Patent No.: US 8,092,137 B2
(45) Date of Patent: Jan. 10, 2012

(54) SUBSTRATE TRANSFER APPARATUS AND METHOD FOR CONTROLLING DOWN FLOW

(75) Inventor: Motoki Miyasaka, Nirasaki (JP)

(73) Assignee: Tokyo Electron Ltd., Minato-ku (JP)

( * ) Notice: Subject to any disclaimer, the term of this patent is extended or adjusted under 35 U.S.C. 154(b) by 632 days.

(21) Appl. No.: 12/284,748

(22) Filed: Sep. 24, 2008

(65) Prior Publication Data

US 2009/0081005 A1   Mar. 26, 2009

(30) Foreign Application Priority Data

Sep. 25, 2007 (JP) .................................. 2007-246541

(51) Int. Cl.
*H01L 21/677*   (2006.01)

(52) U.S. Cl. ......... 414/217; 414/221; 414/805; 414/935
(58) Field of Classification Search .................. 414/217, 414/221, 935, 805
See application file for complete search history.

(56) References Cited

U.S. PATENT DOCUMENTS

| | | | | |
|---|---|---|---|---|
| 5,429,642 | A | * | 7/1995 | Ohkuma ........................ 29/25.01 |
| 5,565,034 | A | * | 10/1996 | Nanbu et al. ................... 118/668 |
| 6,097,469 | A | * | 8/2000 | Yaegashi et al. ................ 355/30 |
| 7,193,682 | B2 | * | 3/2007 | Yonekawa ....................... 355/53 |
| 2001/0048908 | A1 | * | 12/2001 | Zehe et al. ..................... 422/242 |
| 2006/0018736 | A1 | * | 1/2006 | Lee et al. ....................... 414/217 |
| 2006/0182536 | A1 | * | 8/2006 | Rice et al. ...................... 414/217 |

FOREIGN PATENT DOCUMENTS

JP            11-063604            3/1999

* cited by examiner

*Primary Examiner* — Scott Lowe
(74) *Attorney, Agent, or Firm* — Masuvalley & Partners

(57) ABSTRACT

The present invention relates to an apparatus for transferring a substrate through a gate for loading and unloading is provided, and includes a transfer chamber having the gate for loading and unloading the substrate, a transfer system, which is able to move up and down in the transfer chamber and transfers the substrate by accessing each gate, an adjustment section for a gas down flow, which produces the gas down flow in the transfer chamber and is able to adjust a speed of the gas down flow, and a control section for controlling the speed of the gas down flow using the movement speed of the substrate.

20 Claims, 5 Drawing Sheets

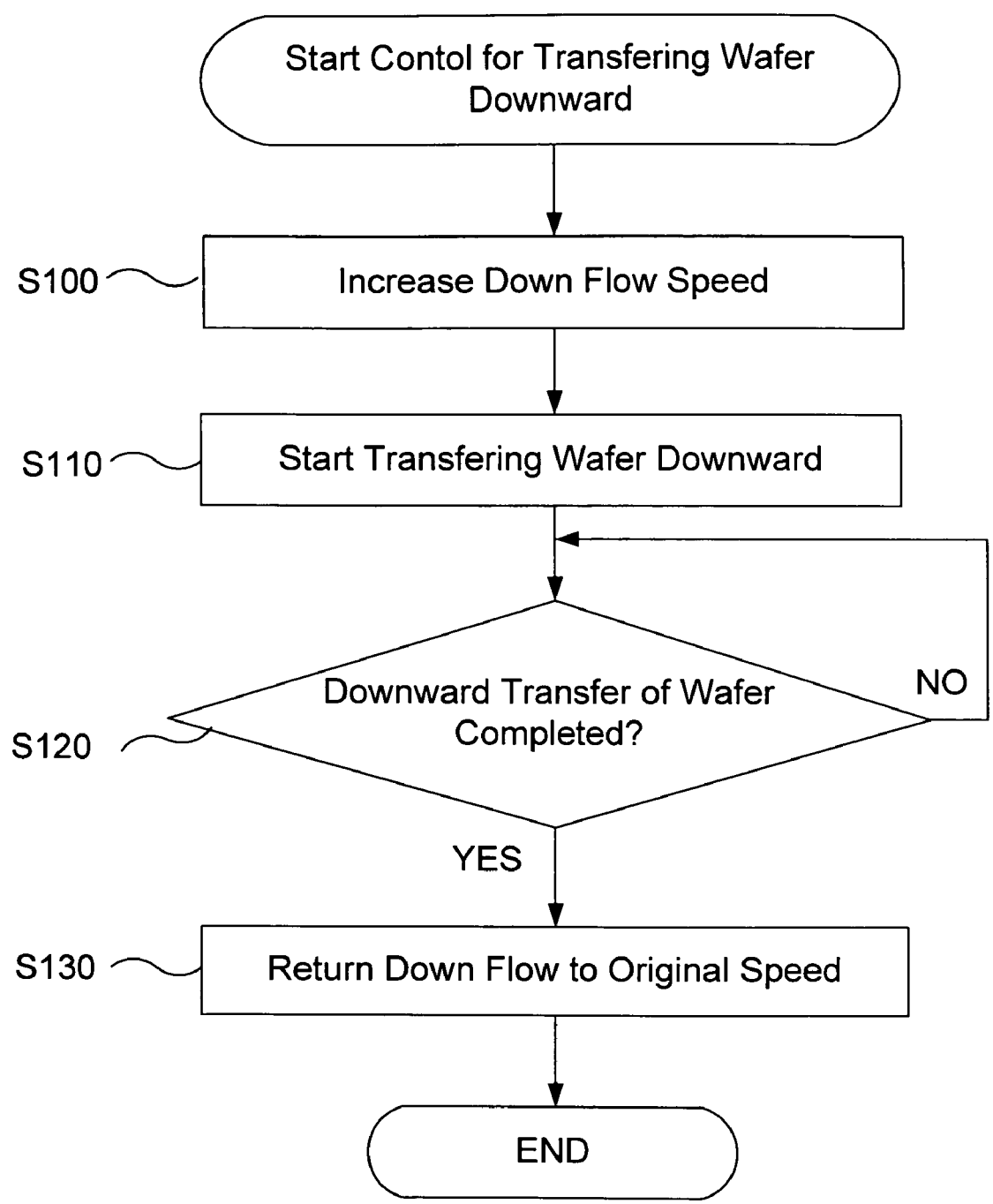

SUBSTRATE TRANSFER APPARATUS AND METHOD FOR CONTROLLING DOWN FLOW

TECHNICAL FIELD

The present invention relates to an apparatus for transferring a substrate and method for controlling down flow.

BACKGROUND OF THE INVENTION

An apparatus for applying a predetermined process treatment, such as an etching process or film forming process, to a substrate to be treated, such as a glass substrate (for example, a liquid crystal substrate) or semiconductor wafer (hereinafter, referred merely as "wafer") is provided with a treatment unit, which includes a treatment chamber connected to a load lock chamber for applying a predetermined treatment to the wafer, for example. Further, the apparatus is provided with a cassette container for storing an untreated wafer transferred into the apparatus or a treated wafer transferred outside the apparatus, and a transfer chamber having a transfer system for passing and receiving the wafer between the load lock chamber etc. In such a transfer chamber, a loading and unloading gate is provided respectively between each of the load lock chamber or cassette container, and the wafer is passed and received between the load lock chamber and cassette container through these loading and unloading gates, for example.

In such an apparatus, as the cassette container storing untreated wafers is set to the cassette table, the untreated wafer is removed from the cassette container by the transfer system in the transfer chamber through the loading and unloading gate to the cassette container, and the wafer is passed onto the treatment unit. This untreated wafer is transferred into the load lock chamber through the loading and unloading gate to this load lock chamber. Thereafter, the wafer is transferred to a treatment chamber from the load lock chamber and a predetermined treatment is applied. The wafer that had been treated in the treatment chamber is returned to the load lock chamber from the treatment chamber. The transfer system in the transfer chamber receives the treated wafer returned to the load lock chamber and returns it to the cassette container.

In the transfer chamber, the transfer of untreated wafers and treated wafers is performed by the transfer system in this way, the operation, such as, wafer transfer etc., causing particles (for example, dust, dirt, fouling, reactive product etc.) to be present in the transfer chamber. These particles may adhere on the surface of the wafer during the transfer, and if the wafer is processed with the particles adhered, this may lead to a decrease in through put. For example, in an etching process, excess etching may occur because of the particles adhered on the surface of the wafer act as a mask, and also in a film forming process, the quality of film may deteriorate because the film is developed with a particle adhered on the surface of the wafer acting as a core. For this reason, in a transfer chamber, particle removal filters, such as, HEPA (High Efficiency Particulate Air) filter or ULPA (Ultra Low Penetration Air) filter, are provided and a predetermined gas, for example an inert gas, such as N2 gas, or air, is cleaned by these filters and the down flow of clean gas described above is formed in the transfer chamber.

In such a down flow, for example, it is common to provide a blower fan and filter on the upper side, as well as an exhaust opening on the lower side of a chamber where down flow is to be formed, and form a down flow of gas by taking clean gas into the chamber from the upper side through the filter by the blower fan, blowing the clean gas downward, and exhausting it from the exhaust opening of the chamber. For an example, refer to Japanese Patent Application Publication No. 11-63604.

By the way, in the transfer chamber, in which a plurality of loading and unloading gates are installed in a horizontal direction, the transfer system is also provided movably in a horizontal direction so as to exchange wafers through each of the loading and unloading gates. Further, the speed of down flow of the clean gas formed in the transfer chamber is adjusted to a constant speed (for example, in a range of 0.25 to 0.35 m/s), thus, without adhering to the surface of the wafer that is being transferred, the particles floating in the chamber can be exhausted outside of the chamber after guiding to the lower side of the transfer chamber along the down flow by transferring the wafer horizontally in this down flow.

However, depending on the configuration of transfer chamber, there may be a case where the plurality of loading and unloading gates are arranged in different heights and the size of the plurality of loading and unloading gates in a height direction is different. For example, in the case of a transfer chamber connecting a plurality of load lock chambers, the loading and unloading gate for each of the load lock chambers may be arranged vertically. Further, in the case of a transfer chamber capable of exchanging wafers between the cassette container, which contains a plurality of wafers arranged in a height direction, the loading and unloading gate with a size larger in the height direction may be provided so that the transfer system can access all of the wafer arranged vertically in that cassette container.

In such a transfer chamber, the transfer system is configured to move not only in a horizontal direction, but in a vertical direction so as to transfer the wafer up and down, and there are cases where the wafer is transferred downward in the same direction as the down flow. However, with the conventional technique, there has been an issue of not being able to sufficiently prevent the adherence of particles to the surface of the wafer because the speed of down flow is maintained at a constant speed and the relative speed of down flow against the wafer transferred downward is decreased depending on the speed of the downward transfer. Especially when the descent speed of the wafer is faster than the speed of down flow, up flow is formed temporarily around the wafer, thus the floating particles are likely to adhere on the surface of the wafer.

Further, in many cases, the gas used in a treatment remains on the surface of the treated wafer that has been applied with a predetermined treatment in the treatment chamber, thus the gas of impurity (out gas) adhered on the surface of the wafer is transferred into the transfer chamber along with the wafer when the wafer is transferred into the transfer chamber as it is. Normally, such out gas is exhausted out of the transfer chamber along the flow of down flow in the transfer chamber while transferring in the transfer chamber. However, if the speed of the down flow is maintained at a constant speed even when the amount of out gas from the treated wafer is large, a high degree of cleanliness in the transfer chamber may not be maintained because such an out gas can not be exhausted entirely and remains on the wafer, or is scattered in the transfer chamber. In this way, because particles attributed from the out gas are adhered on the surface of the treated wafer or an untreated wafer, which is consequently transferred into the transfer chamber, when the degree of cleanliness in the transfer chamber is decreased, there may be a possibility of decreasing the through put.

Considering the descent speed of the wafer in the transfer chamber or the amount of out gas from the treated wafer, a method, in which the speed of down flow is consistently maintained at high speed, can be considered. In this case, however, not only the speed of down flow is unnecessarily maintained to a high speed even in a case when there is no need to increase the speed of down flow, such as when transferring the wafer horizontally or transferring the untreated substrate, but also increasing the power consumption for forming the down flow or shortening the life of expendable parts. Therefore, this method is not appropriate due to these disadvantages.

The present invention has been made considering issues described above and an object is to provide a substrate transfer apparatus and method for controlling down flow that are capable of preventing particles from adhering to the surface of a substrate in a transfer chamber by adjusting the speed of down flow formed in the transfer chamber with an adequate timing.

SUMMARY OF THE INVENTION

One aspect of the present invention is an apparatus for transferring a substrate, which includes, a transfer chamber having a gate for loading and unloading a substrate, a transfer system, which is able to move up and down in the transfer chamber and to transfer the substrate by accessing each gate, an adjustment section for a down flow, which produces the down flow of pure air in the transfer chamber and is able to adjust a speed of the down flow, and a control section for controlling the speed of the down flow with the basis of the movement speed of the substrate.

According to the apparatus for transferring a substrate pertaining to the present invention, the speed of down flow can be controlled based on the moving speed of a substrate, thus, the down flow can be supplied to the surface of the substrate even in a case of, for example, moving the substrate downward in which normally up flow is generated. Therefore, adherence of particles to the surface of the substrate can be prevented because constant down flow can be supplied while transferring the substrate. Furthermore, the speed of the down flow can temporarily increased while transferring the substrate downward only, thus the increase in power consumption can be significantly reduced compared to a case where the speed of the down flow is constantly increased.

In the apparatus for transferring a substrate pertaining to the present invention, the control section controls the adjustment section for down flow, while the substrate is moved at a second speed by the transfer system in the transfer chamber with the down flow at a first speed, so as to make the second speed higher than the first speed. According to this aspect, the speed of down flow is faster compared to the moving speed of the substrate when the substrate is transferred in a downward direction, thus a state where the down flow is generated in the transfer chamber can be maintained constantly. For this reason, adherence of particles to the surface of the substrate can be suppressed.

In the apparatus for transferring a substrate pertaining to the present invention, the transfer system may be further movable in a horizontal direction.

In the apparatus for transferring a substrate pertaining to the present invention, the transfer chamber may include a plurality of gates for loading and unloading the substrate.

In the apparatus for transferring a substrate pertaining to the present invention, the speed of the down flow may at least be increased right before moving the substrate downward by the transfer system. According to this aspect, the substrate can start to move downward after increasing the speed of down flow, thereby the substrate can be moved downward while the down flow of high speed reaches the entire transfer chamber and is stabilized.

In the apparatus for transferring a substrate pertaining to the present invention, the control section controls the adjustment section for down flow so as to increase the speed of the down flow temporarily while transferring a treated substrate, which is treated with a predetermined treatment, in the transfer chamber. In such a case, the speed of down flow is preferably increased while at least the treated substrate is transferred out to other loading and unloading gates after transferring through the loading and unloading gate by the transfer system.

Accordingly, a high speed down flow can be supplied to the treated substrate, which has a high possibility of out gas generation, when the treated substrate is transferred in the transfer chamber. For this reason, the out gas from the treated substrate can be exhausted efficiently outside the transfer chamber, thus the inside of the transfer chamber can be consistently maintained in a clean state. Therefore, the particles attributed from the out gas can be prevented from adhering to the surface of the untreated substrate that is subsequently transferred into the transfer chamber.

In the apparatus for transferring a substrate pertaining to the present invention, it is preferable that the speed of down flow is increased at least right before transferring the treated substrate through the loading and unloading gate by the transfer system. According to this aspect, because the transfer of treated substrate can be started after increasing the speed of down flow, the treated substrate can be transferred in a condition where a high speed down flow is generated across the transfer chamber and stabilized.

In the substrate transfer apparatus pertaining to the present invention, the down flow adjustment section includes, a supply opening for supplying pure air to the transfer chamber, which is positioned on the upper side of the transfer chamber, and a supply fan for supplying pure air to the transfer chamber via the supply opening, wherein a rotation speed of the supply fan is adjustable so as to adjust the speed of the down flow.

In the substrate transfer apparatus pertaining to the present invention, the down flow adjustment section includes, a supply opening for supplying pure air to the transfer chamber, which is positioned on the upper side of the transfer chamber, and a supply valve for controlling a flow volume of pure air, which is supplied to the transfer chamber via the supply opening, wherein the supply valve is configured to adjust a ratio of the opening so as to adjust the speed of the down flow.

In the substrate transfer apparatus pertaining to the present invention, the adjustment section includes, a supply opening for supplying pure air to the transfer chamber, which is positioned at the upper side of the transfer chamber, an exhaust opening, which is positioned at a lower side of the transfer chamber, and an exhaust fan for exhausting air in the transfer chamber via the exhaust opening, wherein the exhaust fan is configured to control a rotation speed of the exhaust fan so as to adjust the speed of the down flow.

In the substrate transfer apparatus pertaining to the present invention, the adjustment section including a supply opening for supplying pure air to the transfer chamber, which is positioned the upper side of the transfer chamber, an exhaust opening, which is positioned at a lower side of the transfer chamber, and an exhaust valve for controlling the flow volume of exhausted air via the exhaust opening, wherein the exhaust valve is preferably configured to control a degree of the exhaust valve opening so as to adjust the speed of the down flow.

In a method of the present invention for controlling the down flow of an apparatus for transferring a substrate, including a transfer chamber having a gate for loading and unloading of a substrate, a transfer system, which is able to move up and down in the transfer chamber and to transfer the substrate by accessing to each gate; and an adjustment section of down flow, which produces a down flow of pure air in the transfer chamber and is able to control a speed of the down flow, the method including the steps of, forming a down flow of a predetermined speed in the transfer chamber, increasing a speed of the down flow so as to be higher than the moving speed of the substrate by controlling the adjusting section while the substrate is transferred downward, and decreasing the speed of the down flow by controlling the adjusting section, after the transfer downward is completed.

The method for controlling down flow pertaining to the present invention, the method further including the steps of, increasing the speed of the down flow by controlling the adjustment section so as to be higher than the predetermined speed while a treated substrate, which is treated with a predetermined treatment, is transferred in the transfer chamber, and decreasing the speed of the down flow by controlling the adjusting section of the down flow, after transfer of the treated substrate is completed.

According to the present invention, the adherence of particles to the surface of a substrate in the transfer chamber can be prevented while suppressing the increase in power consumption and cost for exchanging parts by adjusting the speed of down flow formed in the transfer chamber with an adequate timing.

BRIEF DESCRIPTION OF THE DRAWINGS

FIG. 4 is a flow chart summarizing a control executed in transferring the wafer downward by a control section of an embodiment.

DETAILED DESCRIPTION OF INVENTION

Preferred embodiments of the present invention will be explained in detail referring to the attached drawings. In addition, components described herein and drawings that have substantially the same functions are indicated by the same reference numbers and their explanation will be omitted.

(Configuration Example of Apparatus for Transferring a Substrate)

Figure 1:
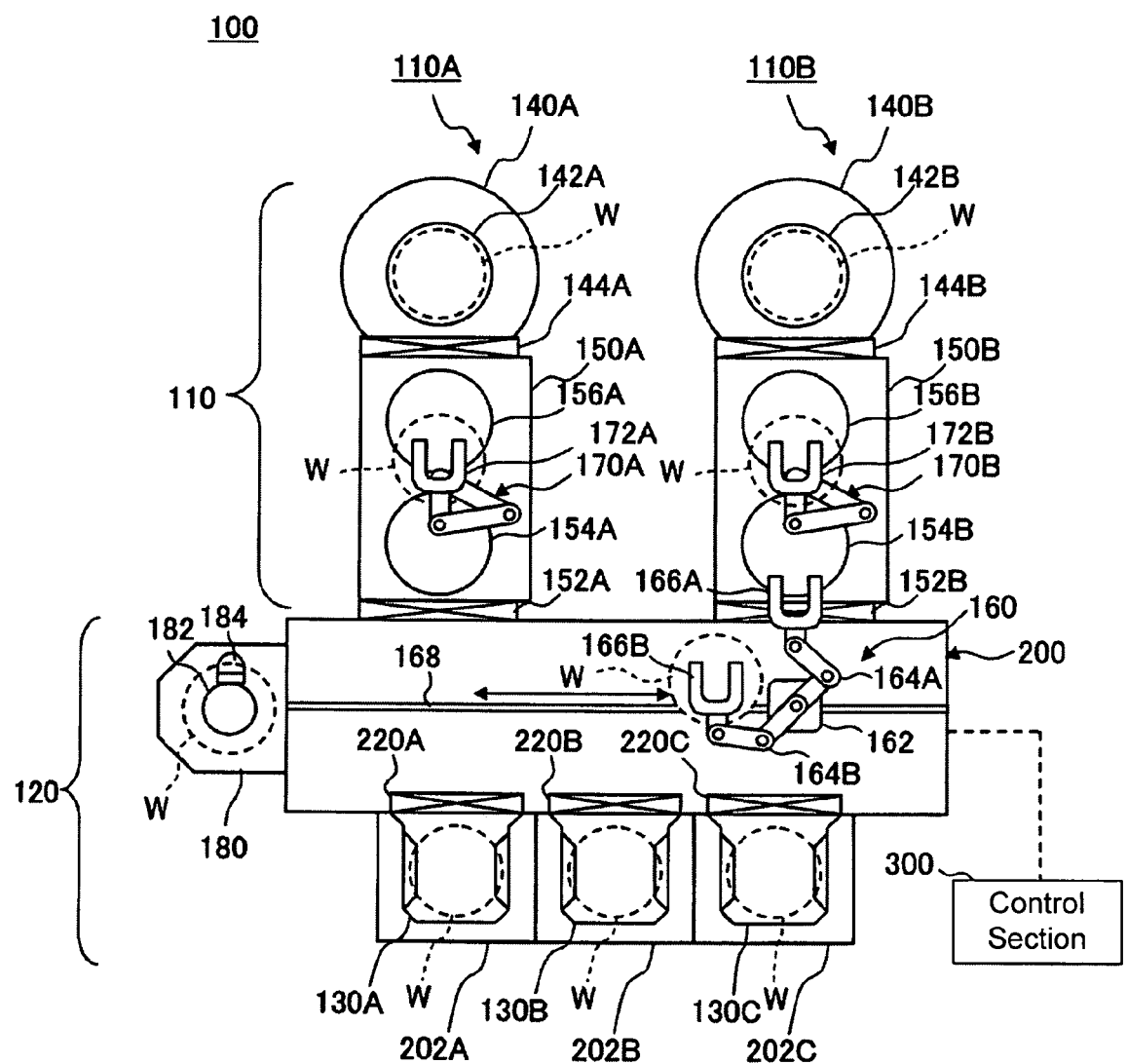
FIG. 1 is a cross-section diagram illustrating an example of a configuration for a substrate treatment apparatus applying an apparatus for transferring a substrate of the present invention.
Figure 2:
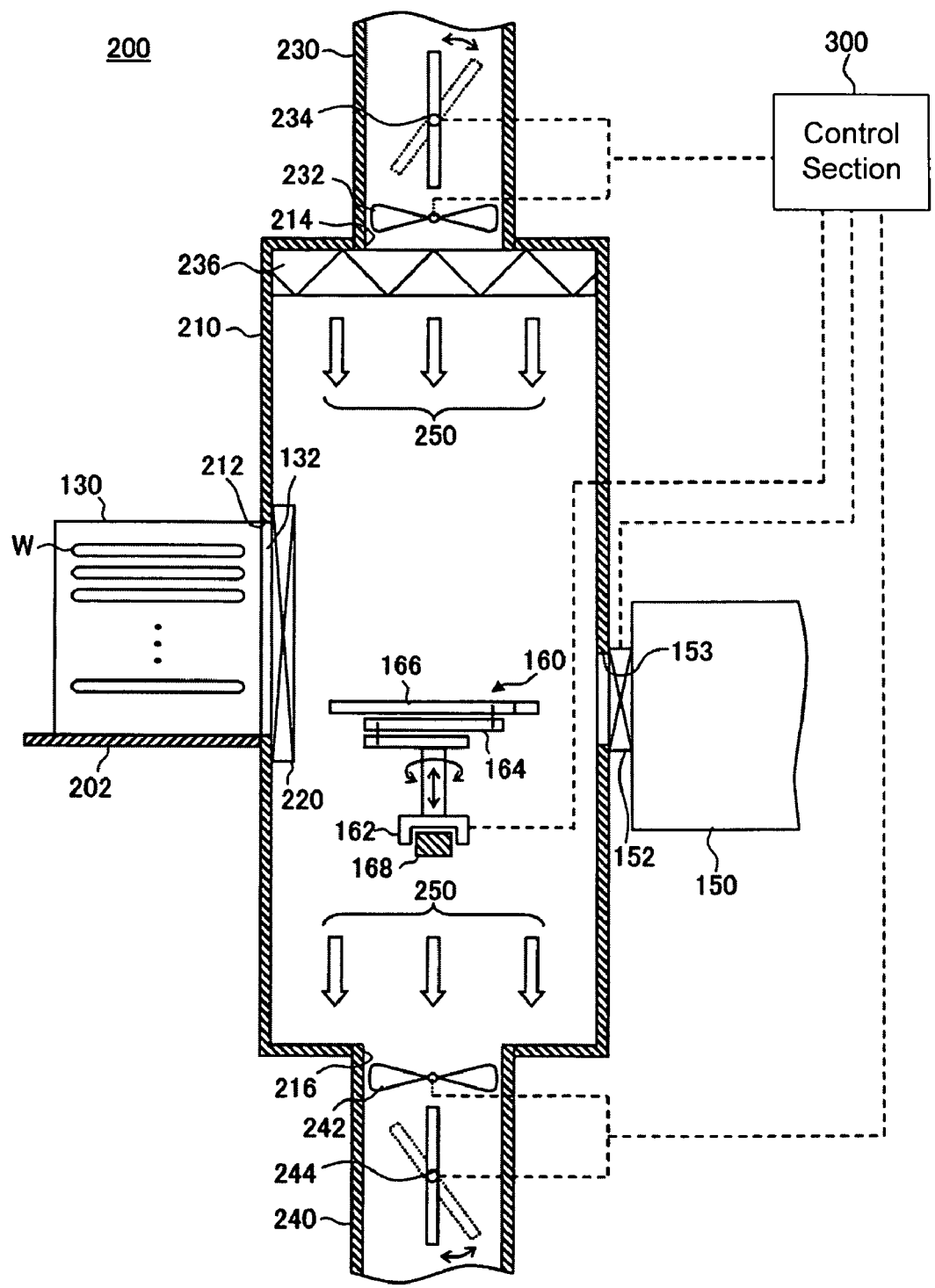
FIG. 2 is a vertical cross section diagram illustrating a configuration of the transfer chamber shown in FIG. 1.

First, an embodiment in which an apparatus for transferring a substrate pertaining to the present invention is applied to a substrate treatment apparatus 100 for performing a predetermined treatment to a substrate, will be explained in detail referring to the figures. Here, explained is an example of the substrate treatment apparatus 100 in which one, or not less than two vacuum treatment units are connected to a transfer chamber and the treatment is performed by transferring the substrate to any of the vacuum treatment units from the transfer chamber. FIG. 1 is a cross section diagram illustrating an outline configuration of the substrate treatment apparatus 100 pertaining to the present invention. FIG. 2 is a vertical cross section diagram illustrating a configuration of the substrate treatment apparatus 100. In addition, cassette containers 130A, 130 B and 130C, and load lock chambers 150A and 150B shown in FIG. 1 are collectively described as a cassette container 130 and load lock chamber 150 in FIG. 2 respectively.

The substrate treatment apparatus 100 is provided with one, or not less than two vacuum treatment units 110 for performing various treatments, such as film forming or etching, to a substrate to be treated, for example, a semiconductor wafer (hereinafter may be referred to merely as a "wafer"), and a transfer unit 120 for loading and unloading the wafer W to the vacuum treatment unit 110. The transfer unit 120 has a transfer chamber 200 which is also commonly used when transferring the wafer W between any one of two or more treatment units.

FIG. 1 shows an example of two vacuum treatment units 110A and 110B installed on a side face of transfer unit 120. Each of the treatment units 110A and 110B is connected to treatment chambers 140A and 140B respectively, and having load lock chambers 150 A and 150B which are able to vacuum. Each of the vacuum treatment units 110A and 110B is to apply, for example, the same types of treatment or different types of treatment to the wafer W in each of the treatment chambers 140A and 140B. In each of the treatment chambers 140A and 140B, placing tables 142A and 142B for placing the wafer W are provided respectively. In addition, the vacuum treatment unit 110 attached to the treatment chamber 140 and the load lock chamber 150 is not limited to two, as additional units may be installed.

The transfer chamber 200 of the transfer unit 120 above is formed from a box figure with a substantially rectangular cross section, where an inert gas, such as N2 gas, and pure air is supplied. The transfer chamber 200 is formed from, for example, stainless or aluminum materials. On a side face forming the long side of the substantially rectangular cross section in the transfer chamber 200, a plurality of cassette tables 202A, 202B and 202C, in which the cassette containers 130A to 130C are set respectively as the container for storing the substrate, are installed in parallel.

Concretely, for example, the cassette container 130 has a hermetic structure capable of storing a maximum of 25 wafers in multiple vertical stages with an equal pitch as shown in FIG. 2. And the inside of the cassette container is filled with, for example, a N2 gas atmosphere.

Further, positioned on one side wall of an enclosure 210 corresponding to the cassette container 130, a loading and unloading gate 212 is located. Passing and receiving the wafer W between the cassette container 130 and transfer chamber 200 is performed through this loading and unloading gate 212.

On the loading and unloading gate 212, a door 220, which is driven by a door drive system (not shown), is provided to open and close the loading and unloading gate 212. This door 220 also functions as a lid removing system to remove and attach a lid 132 of the cassette container 130. When the door 220 is horizontally moved toward the inside of the transfer chamber 200 by the door drive system, the lid 132 is removed from the cassette container 130 and enters into the transfer chamber 200 with the door 220. Then, as the door 220 and lid 132 are evacuated to a predetermined descent position, the loading and unloading gate 212 is in an open state where the wafer W can be loaded and unloaded. Contrarily, when the door 220 and lid 132 are elevated to the position facing the loading and unloading gate 212 and moved forward towards the loading and unloading gate 212, the loading and unloading gate 212 and cassette container 130 are closed.

Each of the gates 212 of the transfer chamber 200 can be opened and closed by opening and closing the lid section of each of the cassette containers 130A to 130C with each of the doors 220A to 220C shown in FIG. 1. In this way, the wafer W can be loaded and unloaded between each of the cassette containers 130A to 130C and transfer chamber 200.

In addition, although FIG. 1 exemplifies the case where each one of three cassette containers 130 A to 130C is placed on each of the cassette tables 202A to 202C, the number of cassette tables and cassette containers is not limited to this, and it may be one, or two, or it may be four of more.

Meanwhile, on the other side face forming a long side of a substantially rectangular cross section in the transfer chamber 200, one end of two load lock chambers 150A and 140B are connected through the gate valves (the gate valves on the atmosphere side) 152A and 152B respectively. The other ends of each of the load lock chambers 150A and 150B are connected to treatment chambers 140A and 150B described above through the gate valves (the gate valves on vacuum side) 144A and 144B respectively.

Concretely, as shown in FIG. 2, on the other wall of the enclosure 210 corresponding to the load lock chamber 150, a loading and unloading gate 153 is formed. The gate valves 152A and 152B are configured to open and close the loading and unloading gates of the wafer W between the transfer chamber 200 and each of the load lock chambers 150A and 150B. In addition, the gate valves 144A and 144B shown in FIG. 1 are configured to open and close the loading and unloading gate (not shown) of wafer W between each of the load lock chambers 150A and 150B and each of the treatment chambers 140A and 140B.

Passing and receiving of the wafer W between the transfer chamber 200 and load lock chamber 150 is performed through the loading and unloading gate 153. Concretely, a gate (not shown) is also provided to the load lock chamber 150 on a position facing the gate 153, and a gate valve 152 is configured to open and close one of, or both of these loading and unloading gates.

Inside of the transfer chamber 200, a common transfer system 160 (atmosphere side transfer system) is provided for transferring a wafer W by accessing each of the loading and unloading gates, such as the loading and unloading gates between each of the cassette containers 130A to 130C, and the loading and unloading gates to each of the load lock chambers 150A and 150B. The common transfer system 160 is a transfer system in the transfer chamber, and it may be hereafter referred merely as "transfer system 160". The transfer system 160 is provided movably in a horizontal direction in the transfer chamber 200, that is, a longitudinal direction of the transfer chamber 200 (direction of arrow shown in FIG. 1), and is also vertically movable.

Concretely, the transfer system 160 is, for example, rotatably and elevatably supported on the base 162. This base 162 is formed so as to slide on a guide rail 168 provided along the longitudinal direction on the center of transfer chamber 200 by, for example, a linear motor drive system. The transfer system 160 may be, for example, be a double arm mechanism having two multiple joint arms 164A and 164B (164 in FIG. 2) and two picks 166A and 166B (166 in FIG. 2) as a substrate supporting section, or may be a single arm mechanism having one pick.

Inside of each load lock chambers 150A and 150B, a pair of placing tables for buffer 154A, 156A and 154B, 156B is provided to temporarily hold the wafer W. Here, the placing tables for buffer 154A and 154B on the transfer chamber 200 side are referred to as a first placing table for buffer, and the placing tables for buffer 156A and 156B on the opposite side are referred as a second placing table for buffer. And between both placing tables for buffer 154A, 156A and 154B and 156B, an individual transfer system (vacuum side transfer system) 170A and 170B, each of which have a multiple joint capable of bending and stretching, and rotating, are provided.

On the top end of these individual transfer systems 170A and 170B, picks 172A and 172B are provided. Using these picks 172A and 172B, the wafer W can be passed and transferred between both the first and second placing tables for buffer 154A, 156A and 154B, 156B. In addition, loading and unloading of the wafer W from the load lock chambers 150A and 150B into the treatment chambers 140A and 140B is performed by using each of the individual transfer systems 170A and 170B described above.

On the one end of the transfer chamber 200, that is, one side face forming the short side of the substantially rectangular cross section, an orienter (pre-alignment stage) 180 is connected as a positioning chamber to position the wafer W through the loading and unloading gate of the wafer W. In order to align the wafer W by detecting the orientation flat or notch, one side of the orienter 180 is, for example, provided with a rotation placing table 182 and an optical sensor 184 for optically detecting the peripheral portion of the wafer W.

The transfer chamber 200 is provided with a down flow adjustment section which forms the down flow of the clean gas in the transfer chamber, and is capable of adjusting the speed of the down flow. The down flow adjustment section constantly forms a certain amount of flow by bringing clean gas in from the upper portion of the transfer chamber 200 and exhausting from the exhaust opening located on the lower portion. The down flow adjustment section of the embodiment is configured to change the speed of the down flow as necessary. The detail of a concrete configuration for such a down flow adjustment section is described later.

The substrate treatment apparatus 100 is provided with a control section 300 to control the operation of the entire apparatus. The control section 300 executes a predetermined program based on a predetermined setting information to control each section. In this way, for example, the process treatment in the treatment chambers 140A and 140B, the wafer transfer process in the load lock chambers 150A and 150B, and transfer chamber 200, and the alignment process at the orienter are performed. Further, the control section 300 also controls the operation of the transfer chamber including, opening and closing of gate valves 144 and 152 and door 220 and the down flow adjustment section described later.

(Configuration Example of the Down Flow Adjustment Section)

For example, the down flow adjustment section is configured as shown in FIG. 2. That is, an air supply opening 214 is formed on the ceiling of the enclosure 210 of the transfer chamber 200, and an air supply pipe 230 is connected to this air supply opening 214 for introducing an inert gas, such as N2, or air into the transfer chamber 200. Inside of the supply pipe 230, an air supply fan 232 for introducing a predetermined gas into the transfer chamber 200 from the air supply opening 214, and an air supply valve 234 for adjusting a flow rate of the gas in the air supply pipe 230 are provided.

On the downstream side of the air supply opening 214, provided is an air supply filter 236 to remove particles contained in the gas introduced into the transfer chamber 200 by the supplying fan 232. This air supply filter 236, for example, maby be a HEPA (High Efficiency Particulate Air) filter, or an ULPA (Ultra Low Penetration Air) filter. In addition, the air supply filter is not limited to those described above. For example, a chemical filter, activated carbon filter, or a filter combining these may be used to configure the air supply filter 236.

On the bottom of the enclosure 210 of the transfer chamber 200, an exhaust opening 216 is formed, and an exhaust pipe 240 is connected to this exhaust opening 216 to exhaust gas from the transfer chamber 200. In the exhaust pipe 240, an exhaust fan 242 is provided to actively exhaust gas in the transfer chamber 200 to outside of the transfer chamber 200 through the exhaust opening 216 and an exhaust valve 244 to adjust the flow rate of the gas in the exhaust pipe 240.

In this embodiment, the air supply fan 232, air supply valve 234, air supply filter 236, exhaust fan 242 and exhaust valve 244 cooperate and function as a down flow adjustment section for forming the down flow 250 of a clean gas in the transfer chamber 200 and also adjust the speed of the down flow 250. Concretely, the air which is introduced into the transfer chamber 200 from the air supply opening 214 by the air supply fan 232 and that is cleaned with the air supply filter 236, is exhausted outside the transfer chamber 200 from the exhaust opening 216 through the inside of the transfer chamber by the exhaust fan 242. At this time, the down flow 250 of cleaned gas flowing from the ceiling to the bottom section is formed in the transfer chamber 200. This down flow 250 functions to exhaust particles outside of the transfer chamber without adhering to the surface of the wafer W.

The rotation speed of the air supply fan 232 and exhaust fan 242 are controlled by the control section 300 respectively. And the control section 300 also controls the degree of opening for the air supply valve 234 and exhaust valve 244. By increasing the rotation speed of the air supply fan and exhaust fan 242, the speed of the down flow 250 can be increased. Further, by increasing the degree of opening of the air supply valve 234 and exhaust valve 244, the flow rate of the clean air introduced into the transfer chamber 200 is increased, thereby the speed of the down flow can be increased. In such a case, in order to return the speed of down flow 250 to the original speed, the rotation speed of the air supply fan 232 and exhaust fan 242, or the degree of opening of the air supply valve 234 and exhaust valve 244 is decreased.

In addition, the down flow adjustment section pertaining to the present invention is formed from the air supply fan 232, air supply valve 234, air supply filter 236, exhaust fan 242, and exhaust valve 244; however, the present invention is not limited to this configuration. For example, the down flow adjustment section may be formed by omitting either one of the air supply fan 232 or air supply filter 236. Further, either one of, or both of the air supply valve 234 and exhaust valve 244 may be omitted.

Further, it is favorable to install a plurality of the air supply fans 232 and exhaust fans 242 according to the size of the enclosure 210. Thereby, the down flow 250 maintains an even speed and flow rate across the transfer chamber 200.

Since the down flow 250 with clean air can be formed by the down flow adjustment section in such a transfer chamber 200, particles can be exhausted out of the transfer chamber 200 on the down flow even if those particles are floating within the transfer chamber 200. Further, the control section 300 can maintain the speed of the down flow, for example, to 0.3 m/s by controlling the rotation speeds of the air supply fan 232 and exhaust fan 242 and the degree of opening of the air supply valve 234 and exhaust valve 244. Therefore, adherence of particles to the surface of the wafer W transferred by the transfer system 160 in the transfer chamber 200 can be prevented.

By the way, as shown in FIG. 2 the loading and unloading gate 212 to the cassette container 130 is formed in a rectangular shape larger on a long side so that the transfer system can access all the wafers W arranged in a vertical direction (up and down direction) in the cassette container 130. Contrarily, the loading and unloading gate 153 to the load lock chamber 150 is formed in a rectangular shape smaller on a long side direction compared to the loading and unloading gate 212 so as to align with a height of the placing table 154A (or 156A) and 154B (or 156B). For this reason, depending on the storing position of the cassette container 130, the wafer W may need to be transferred downward when the wafer W is transferred to the load lock chamber 150 by removing the wafer W from the cassette container 130 by the transfer system 160.

In addition, the wafer W needs to be transferred downward when the loading and unloading gate to the orienter 180 provided on the transfer chamber 200 is located at a higher position than the loading and unloading gate 153 of the load lock chamber 150 or the loading and unloading gate 122 of the cassette container 130.

In the case of transferring the wafer W downward by the transfer system 160 in this way, adherence of particles to the surface of wafer W may not be prevented sufficiently if the down flow is formed at a constant speed as the conventional technique. For example, in a case when transferring the wafer W downward, the relative speed of the down flow 250 against the wafer W transferred downward is slower than the relative speed of the down flow 250 against the wafer W in a standby state or moving horizontally. Especially when the descent speed of the wafer W is faster than the speed of the down flow 250 (for example, 0.3 m/s), up flow is temporarily formed around the wafer W when viewed from the wafer W as it is transferred downward, thus floating particles are likely to adhere on the surface of wafer W. On the contrary, such a problem does not occur when the wafer W is transferred upward or in a horizontal direction, thus there is no need for increasing the speed of down flow 250.

Further, when the amount of out gas is large on the treated wafer W, which is treated in the treatment chamber 140, the adherence of particles to the surface of wafer W may not be sufficiently prevented if a down flow of constant speed (for example 0.3 m/s) is formed as is known in the conventional technique while transferring the treated wafer W into the transfer chamber 200 from the load lock chamber 150 and then to cassette container 130 by the transfer system 160. That is, depending on the amount of out gas from the treated wafer W, a high degree of cleanliness in the transfer chamber 200 may not be maintained because all of the out gas can not be guided out the transfer chamber 200 by the down flow 250. In this way, when the degree of cleanliness in the transfer chamber 200 decreases, particles attributed from the out gas will adhere on the surface of the treated wafer W or untreated wafer W subsequently transferred in the transfer chamber 200, which may result in a decrease in through put. Contrarily, the problem described above does not occur when transferring the untreated wafer W, thus there is no need for increasing the speed of down flow 250 except for transferring the wafer W downward.

Therefore, the down flow adjustment section pertaining to the embodiment can prevent particles from adhering to the surface of the wafer W in any transfer conditions by temporarily changing the speed of down flow 250 formed in the transfer chamber 200 depending on a transfer condition of wafer W.

(Example of Operations of the Substrate Treatment Apparatus)

Examples of operation of the substrate treatment apparatus 100 including the speed control of the down flow are hereinafter explained. The control section 300 forms a down flow 250 of a predetermined speed in the transfer chamber 200 by controlling the down flow adjustment section according to the operation of the substrate treatment apparatus 100. At this time, the speed of the down flow 250 is adjusted to, for example, 0.3 m/s, which is a normal speed.

As the predetermined speed of down flow 250 is formed in the transfer chamber 200 and the cassette container 130 storing a plurality of wafers W is set to cassette table 202, the door 220 opens lid 132 and the plurality of wafers are evacuated to the lower side in the transfer chamber 200. Therefore, the loading and unloading gate 212 is in an open state.

Next, the wafer W, which is to be treated, is removed from the cassette container 130 by the transfer system 160 and transferred into the transfer chamber 200, which then transferred in the horizontal direction until right in front of the orienter 180. At this time, when the loading and unloading gate of the orienter 180 is located at a higher position, the wafer W is transferred into the orienter 180 after aligning the height of the wafer W by transferring upward by the transfer system 160. Then the wafer W is aligned in the orienter 180.

When the alignment by the orienter 180 is completed, the wafer W is taken out of the orienter 180 by the transfer system 160 and transferred in a horizontal direction until right in front of the loading and unloading gate 153 to the load lock chamber 150. At this time, when the loading and unloading gate 153 is at a lower position, the wafer W is transferred downward by the transfer system 160 to align with the height of the loading and unloading gate 153.

In this embodiment, when performing such a downward transfer of the wafer W, the speed of the down flow 250 is adjusted to be higher than the normal speed while the wafer W is transferred downward so the relative speed of the down flow 250 against the descending wafer W is sufficient.

Figure 3A:
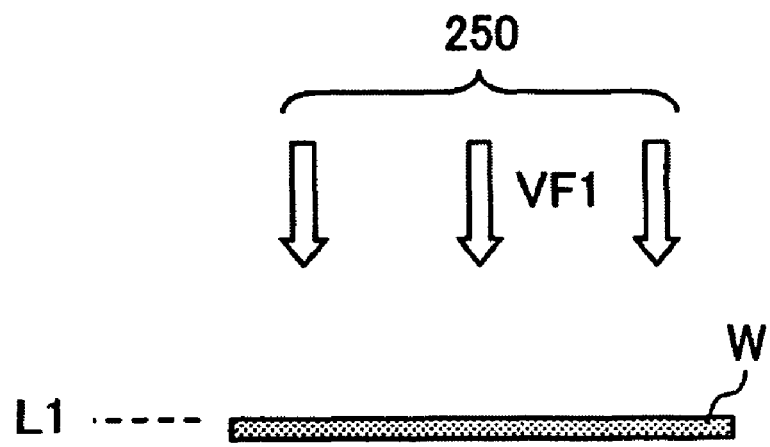
FIG. 3A illustrates a relationship of a wafer before it is transferred downward and the speed of a down flow.
Figure 3B:
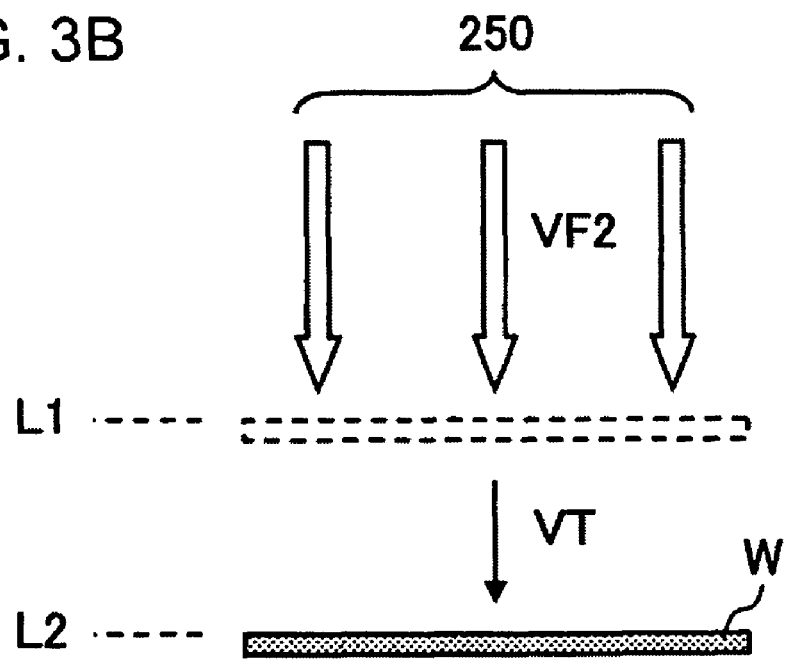
FIG. 3B illustrate a relationship of wafer transferred downward and the speed of down flow.

Here, the relation of the decent speed of the wafer W and speed of the down flow 250 is shown in FIGS. 3A and 3B. FIG. 3A is a drawing conceptually illustrating a relation of the wafer W before transferring downward and speed VF1 of the down flow 250, and FIG. 3B is a drawing conceptually illustrating a relation of speed VT when the wafer W is transferred downward from a height L1 to a height L2 and speed VF2 of the down flow 250. In addition, the difference in length of outlined arrows in the FIGS. 3A and 3B indicates the difference in the speed of the down flow 250. That is, it indicates that the speed VF2 is faster than the speed VF1.

In order to make the relative speed of the down flow 250 supplied to the descending wafer W to VF1 when the descending speed of the wafer W is VT, the control portion 300 should control the down flow adjustment section to increase the speed of down flow 250 from VF1 to VF2 (=VF1+VT). For example, the speed VF2 of down flow 250 is the descending speed VT to which is added the normal speed of the down flow 250 (for example 0.3 m/s), so that the relative speed of the down flow 250 viewed from the wafer W can be the same as the normal speed even when the wafer W is transferred downward.

FIG. 4 is a concrete example of a flow chart showing a summary of control performed by the control section 300 when the wafer W is transferred downward. FIG. 4 is a flow chart showing a timing of the downward transfer control for the wafer W of the transfer system 160 and down flow speed control of the down flow adjustment section by the control section 300. As shown in FIG. 4, the control section 300 increases the speed of down flow 250 by controlling down flow adjustment section in step S100. Concretely, for example, by increasing the rotation speed of the air supply fan 232 and exhaust fan 242, the speed of the down flow is adjusted to the speed which is predetermined to a value higher than the normal speed (speed of the downward transfer). Further, even when the rotation speeds of the air supply fan 232 and exhaust fan 242 are constant, the speed of down flow 250 can be increased by increasing the flow rate of the pure gas introduced into the transfer chamber 200 by increasing the degree of opening of the air supply valve 234. In addition, when the degree of opening of the air supply valve 234 is increased, it is preferable to increase the flow rate of the gas exhausted from the transfer chamber 200 by also increasing the degree of opening of the exhaust valve 244 in conjunction with the air supply valve 234.

Thereafter, the control section 300 controls the transfer system 160 to start the downward transfer of the wafer W at step S110. By starting the downward transfer of the wafer W after increasing the speed of the down flow 250, the wafer W can be transferred downward while the down flow 250 at a fast speed reaches across the transfer chamber 200 and is stabilized.

And, in step S120, the control section 300 determines as to whether the downward transfer of the wafer W by the transfer system 160 is finished or not. And when the downward transfer is determined to be finished, the control section 300 returns the speed of the down flow 250 to the original speed at step S130. In this way, an up flow can be prevented from generating on the surface of the wafer W at the downward transfer by temporarily increasing the down flow speed while transferring the wafer W downward, thus particles are prevented from adhering to the surface of the wafer W while transferring downward. Further, because the speed of the down flow is returned to the normal speed when the downward transfer is finished, for example, an increase of power consumption can be suppressed to a minimum and also the decrease in life of the filter etc. is suppressed to a minimum compared to a case where the down flow is constantly set to a faster speed than the normal speed.

In this way, the wafer W is transferred downward by the transfer system 160 and aligned to the height of the loading and unloading gate 153. And when the gate valve 152 is opened, the wafer W, which is retained by the transfer system 160, is transferred into the load lock chamber 150 from the transfer chamber 200. When the wafer W is transferred into the load lock chamber 150, the gate valve 152 is closed.

Next, when the gate valve 144 is opened, the wafer W, which is transferred into the load lock chamber 150 by the individual transfer system 170, is carried out to the treatment chamber 140. When the wafer W is loaded into the treatment chamber 140, the gate valve 144 is closed and a predetermined treatment, such as an etching treatment or a film forming treatment, is performed to the wafer W in the treatment chamber 140.

Next, as the gate valve 144 is opened after finishing the predetermined treatment in the treatment chamber 140, the treated wafer W is transferred into the load lock chamber 150 by the individual transfer system 170. When the treated wafer W is transferred into the load lock chamber 150, the gate valve 144 is closed and the inside of the load lock chamber 150 is returned to atmospheric pressure in order to eliminate the pressure difference of the transfer chamber 200, which is in an atmospheric pressure state, and the load lock chamber 150, which is in a vacuum state. Then, the gate valve 152 is opened and the transfer operation of the treated wafer W to the transfer chamber 200 by the transfer system 160 is performed.

In this embodiment, when such a treated wafer W is transferred, the speed of down flow 250 is adjusted to the speed faster than the normal speed while the treated wafer W is transferred in the transfer chamber 200 in order to form the down flow sufficient to exhaust the out gas from the treated wafer W.

Figure 5:
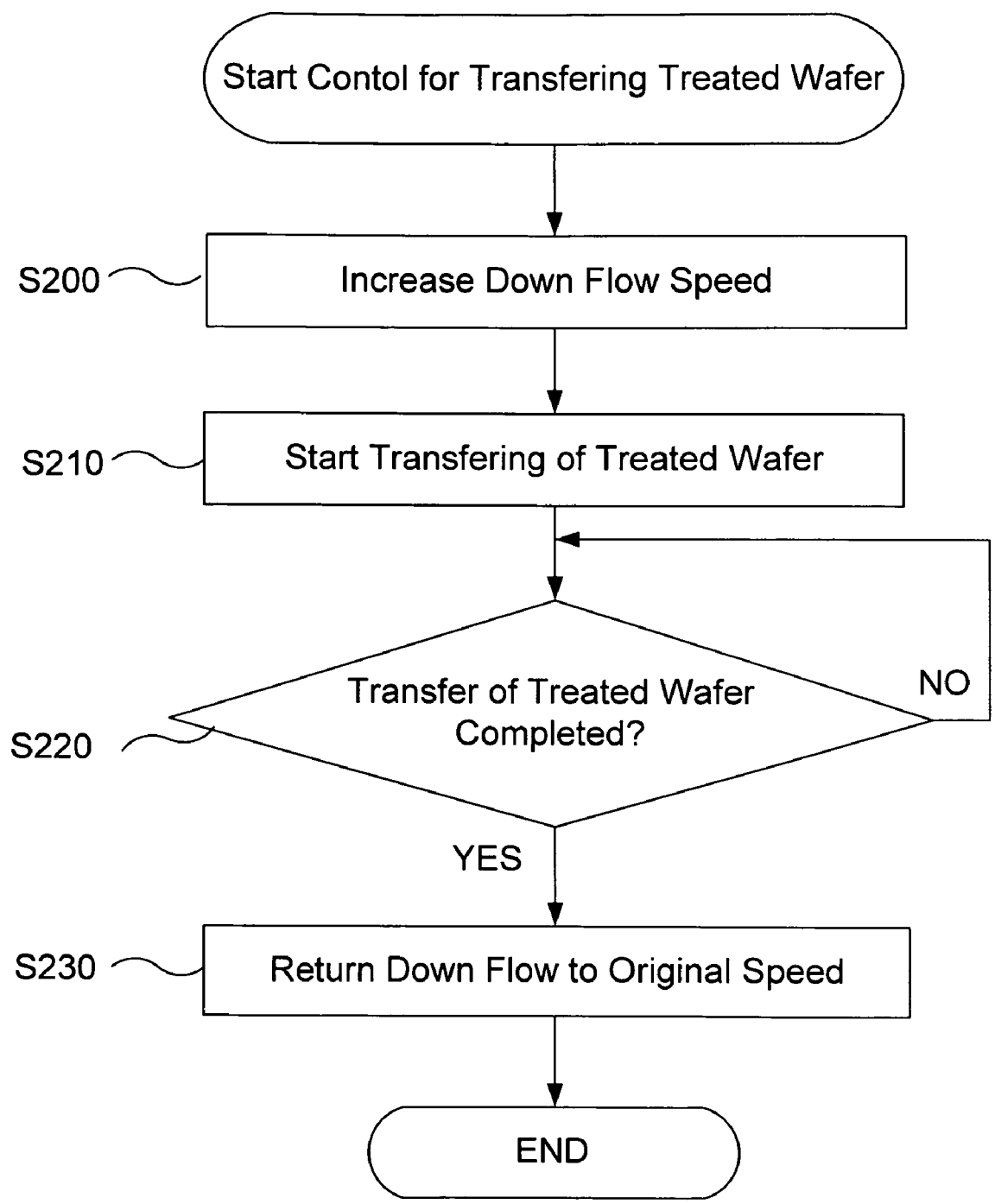
FIG. 5 is a flow chart summarizing a control executed in transferring a processed wafer by a control section in an embodiment.

FIG. 5 is a concrete example of a flow chart showing a summary of controls performed by the control section 300 when the treated wafer W is transferred. FIG. 5 shows a timing of transfer control of the treated wafer W of the transfer system 160 by the control section 300 and the down flow speed control of the down flow adjustment section. As shown in FIG. 5, first, the control section 300 controls the down flow adjustment section to increase the speed of down flow 250 at step S200. Here, for example, as with the downward transfer of the wafer W described above, the speed is adjusted to a preset speed in a value faster than the normal speed (the speed at the transfer of the treated wafer W) by increasing the rotation speed of the air supply fan 232 and exhaust fan 242, or increasing the degree of opening of the air supply valve 234 and exhaust valve 244.

In addition, the speed of transferring the treated wafer W and speed of downward transfer may be the same or different. The speed of downward transfer is preferably configured to an appropriate speed in advance based on, for example, descent speed of the transfer system 160, and the speed of transferring the treated wafer W is preferably configured to an appropriate speed in advance based on, for example, the amount of outgas of the treated wafer W.

Thereafter, the control section 300 controls the transfer system 160 to start transferring the treated wafer W at step S210. That is, the control is performed so that the transfer system 160 transfers the treated wafer W into the transfer chamber 200 from the load lock chamber 150 and further to return the wafer W into the cassette container 130. In this way, the treated wafer W can be transferred in a condition where the down flow 250 with a fast speed is flown across the transfer chamber 200 and stabilized by starting the transfer of treated wafer W after increasing the speed of down flow 250.

Then, in step S220, a determination is made as to whether the series of transfer of the treated wafer W is completed or not. When the transfer is determined to be completed, the control section 300 returns the speed of down flow 250 to the normal speed in step S230. Thus, the predetermined treatment to a single wafer W is completed. In this way, the inside of the transfer chamber 200 can be maintained in a clean state because the out gas can be sufficiently exhausted when transferring the treated wafer W by increasing the speed of down flow temporarily while transferring the treated wafer W. As a result, adherence of particles to the surface of the treated wafer W or untreated wafer W, which is transferred into the transfer chamber 200 subsequently, can be prevented.

According to the above described embodiment, the adherence of particles to the surface of wafer W can be steadily prevented compared to the conventional technique by forming the down flow at a normal speed in the transfer chamber 200 and controlling the speed of the down flow so as to temporarily increase the speed depending of the condition of the wafer W transfer.

In addition, because the speed of down flow 250 is increased temporarily and for a short time such as when transferring the wafer W downward or transferring the treated wafer W, the increase in power consumption can be suppressed significantly compared to a case where the speed of down flow 250 is consistently increased. Further, the increase in speed and flow rate of the clean gas passing through the air supply filter 236 is also temporary, thus the life of the air supply filter 236 will not be shortened unnecessarily.

Preferred embodiments of the present invention are explained above with reference to the drawings. However, it is apparent that the present invention is not limited to these embodiments. It is apparent to one skilled in art that various changes and modifications may be made without departing from the scope of the claims, and it is understood that those changes and modifications fall within the scope of the present invention.

For example, the present invention may be applied to various types of substrate treatment apparatus other than the substrate treatment apparatus 100 pertaining to the embodiment. For example, the present invention may be applied to a cluster tool type deposition treatment apparatus, vertical-type heat treatment apparatus, and coating and developing apparatus.

The present invention may be applied to a substrate transferring apparatus as a method for controlling down flow.

What is claimed is:

1. A substrate transfer apparatus comprising:
   a transfer chamber having a gate for loading and unloading a substrate;
   a transfer system movable in a horizontal direction and a vertical direction for transferring the substrate within the transfer chamber;
   a down flow adjustment unit for forming a down flow of a clean gas in the transfer chamber; and
   a control unit for adjusting a speed of the down flow of the clean gas depending on either a relative velocity condition or a substrate condition.

2. The apparatus of claim 1, wherein the relative velocity condition comprises a condition in which the relative velocity of down flow with respect to the substrate is lower than a predetermined flow rate.

3. The apparatus of claim 2, wherein the control unit increases the speed of the down flow of the clean gas so as to maintain the relative velocity of down flow with respect to the substrate not less than the predetermined flow rate.

4. The apparatus of claim 3, wherein a downward movement of the substrate starts after the speed of down flow of the clean gas is increased and further stabilized across the transfer chamber.

5. The apparatus of claim 2, wherein the predetermined flow rate includes a flow rate ranging from 0.25 m/s to 0.35 m/s.

6. The apparatus of claim 1, wherein the substrate condition comprises a condition in which the substrate to be transferred is treated with a predetermined treatment in a treatment chamber.

7. The apparatus of claim 6, wherein the control unit increases the speed of the down flow of the clean gas to a preset value so as to maintain a high degree of cleanness across the transfer chamber.

8. The apparatus of claim 7, wherein the preset value is determined as a function of the predetermined treatment.

9. The apparatus of claim 7, wherein a process of loading and unloading of a treated substrate start after the speed of down flow of the clean gas is increased and further stabilized across the transfer chamber.

10. The apparatus of claim 1, wherein the transfer chamber includes a plurality of gates for loading and unloading a plurality of substrates.

11. The apparatus of claim 1, wherein the down flow adjustment unit comprises:
   a supply opening, positioned on an upper side of the transfer chamber, for supplying the clean gas into the transfer chamber,
   a supply fan for introducing the clean gas into the transfer chamber via the supply opening, wherein a rotation speed of the supply fan is selectively adjustable so as to vary the speed of the down flow of the clean gas.

12. The apparatus of claim 11, wherein the down flow adjustment unit further comprises:
   an exhaust opening, positioned on a lower side of the transfer chamber, and
   an exhaust fan for exhausting the clean gas from the transfer chamber via the exhaust opening, wherein a rotation speed of the exhaust fan is selectively adjustable so as to vary the speed of the down flow of the clean gas.

13. The apparatus of claim 1, wherein the down flow adjustment unit comprises:
   a supply opening, positioned on an upper side of the transfer chamber, for supplying the clean gas into the transfer chamber,
   a supply valve for controlling a flow volume of the clean gas introduced into the transfer chamber via the supply opening, wherein an opening degree of the supply valve is selectively adjustable so as to vary the speed of the down flow of the clean gas.

14. The apparatus of claim 13, wherein the down flow adjustment unit further comprises:
   an exhaust opening, positioned on a lower side of the transfer chamber, and
   an exhaust valve for controlling a flow volume of the clean gas from the transfer chamber via the exhaust opening, wherein an opening degree of the exhaust valve is selectively adjustable so as to vary the speed of the down flow of the clean gas.

15. A method for controlling a clean gas down flow in a substrate transfer apparatus, the method comprising the steps of:
   forming the clean gas down flow at a predetermined flow rate in a transfer chamber;
   determining whether a relative velocity of down flow with respect to a substrate is lower than the predetermined flow rate;
   increasing a speed of the down flow of the clean gas if the relative velocity of down flow with respect to the substrate is lower than the predetermined flow rate, and
   decreasing the speed of the down flow of the clean gas after a downward transfer of the substrate is completed.

16. The method of claim 15, wherein the speed of the down flow of the clean gas is increased so as to maintain the relative velocity of down flow with respect to the substrate not less than the predetermined flow rate, and wherein the predetermined flow rate ranges from 0.25 m/s to 0.35 m/s.

17. The method of claim 15 further comprising the steps of:
   determining whether the substrate to be transferred is treated with a predetermined treatment in a treatment chamber;
   increasing the speed of the down flow of the clean gas to a preset value if the substrate to be transferred is treated with the predetermined treatment in the treatment chamber,
wherein:
   the preset value is determined as a function of the predetermined treatment, and
   the speed of the down flow of the clean gas is increased so as to maintain a high degree of cleanness across the transfer chamber; and
decreasing the speed of the down flow of the clean gas after transferring of a treated substrate is completed.

18. A substrate transfer device having a transfer chamber with a plurality of gates for loading and unloading a plurality of substrates, the substrate transfer device comprising:
   a substrate transfer mechanism freely movable in a horizontal direction and a vertical direction to access each of the plurality of gates for transferring one substrate from the plurality of substrates within the transfer chamber;
   means for forming a down flow of a clean gas in the transfer chamber, wherein a flow rate of the clean gas is adjustable; and
   a control unit for adjusting the flow rate of the clean gas, wherein the control unit:
      forms the down flow of the clean gas at a predetermined flow rate,
      determines whether a relative velocity of down flow with respect to the substrate is lower than the predetermined flow rate,
      increases temporarily the flow rate of the clean gas if the relative velocity is lower than the predetermined flow rate so that the relative velocity remains equal to or higher than the predetermined flow rate while the substrate is moving downward by the substrate transfer mechanism.

19. The substrate transfer device of claim 18, wherein the control unit further:
   determines whether the substrate to be transferred is treated with a predetermined treatment in a treatment chamber,
   increases temporarily the flow rate of the clean gas to a preset value depending on the predetermined treatment so that a high degree of cleanness across the transfer chamber is maintained.

20. The substrate transfer device of claim 18, wherein the means for forming the down flow of the clean gas in the transfer chamber comprises:
   a supply fan for introducing the clean gas into the transfer chamber via a supply opening positioned on an upper side of the transfer chamber, wherein a rotation speed of the supply fan is adjustable so as to vary the speed of the down flow of the clean gas;
   a supply valve for controlling a flow volume of the clean gas introduced into the transfer chamber via the supply opening, wherein an opening degree of the supply valve is adjustable so as to vary the speed of the down flow of the clean gas;
   a supply filter;
   an exhaust fan for exhausting the clean gas from the transfer chamber via an exhaust opening positioned on a lower side of the transfer chamber, wherein a rotation speed of the exhaust fan is adjustable so as to vary the speed of the down flow of the clean gas; and
   an exhaust valve for controlling a flow volume of the clean gas from the transfer chamber via the exhaust opening, wherein an opening degree of the exhaust valve is adjustable so as to vary the speed of the down flow of the clean gas.

* * * * *